US012573440B2

(12) United States Patent

Kitagawa

(10) Patent No.: US 12,573,440 B2
(45) Date of Patent: Mar. 10, 2026

(54) COMPENSATING FOR VOLTAGE OFFSET IN MEMORY

(71) Applicant: Micron Technology, Inc., Boise, ID (US)

(72) Inventor: Makoto Kitagawa, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 142 days.

(21) Appl. No.: 18/649,393

(22) Filed: Apr. 29, 2024

(65) Prior Publication Data

US 2024/0371425 A1 Nov. 7, 2024

Related U.S. Application Data

(60) Provisional application No. 63/463,230, filed on May 1, 2023.

(51) Int. Cl.
*G11C 11/22* (2006.01)

(52) U.S. Cl.
CPC ...... *G11C 11/2273* (2013.01); *G11C 11/2259* (2013.01); *G11C 11/2293* (2013.01)

(58) Field of Classification Search
CPC ............ G11C 11/2273; G11C 11/2259; G11C 11/2293
See application file for complete search history.

(56) References Cited

U.S. PATENT DOCUMENTS

| | | | |
|---|---|---|---|
| 10,446,232 B2 | 10/2019 | Di Vincenzo et al. | |
| 10,504,576 B2 | 12/2019 | Vimercati | |
| 2018/0226116 A1 | 8/2018 | Derner et al. | |
| 2019/0043595 A1 | 2/2019 | Vimercati et al. | |
| 2021/0082489 A1 | 3/2021 | Toops | |
| 2024/0212735 A1* | 6/2024 | Kitagawa | G11C 11/221 |

* cited by examiner

*Primary Examiner* — Han Yang

(74) *Attorney, Agent, or Firm* — Brooks, Cameron & Huebsch, PLLC

(57) ABSTRACT

The present disclosure includes apparatuses, methods, and systems for compensating for voltage offset in memory. An embodiment includes a memory having an array of memory cells, and circuitry configured to sense a data state of a memory cell of the array by applying a voltage to a data line coupled to the memory cell and a plate of the memory cell, wherein the voltage applied to the plate is delayed relative to the voltage applied to the data line.

20 Claims, 6 Drawing Sheets

106
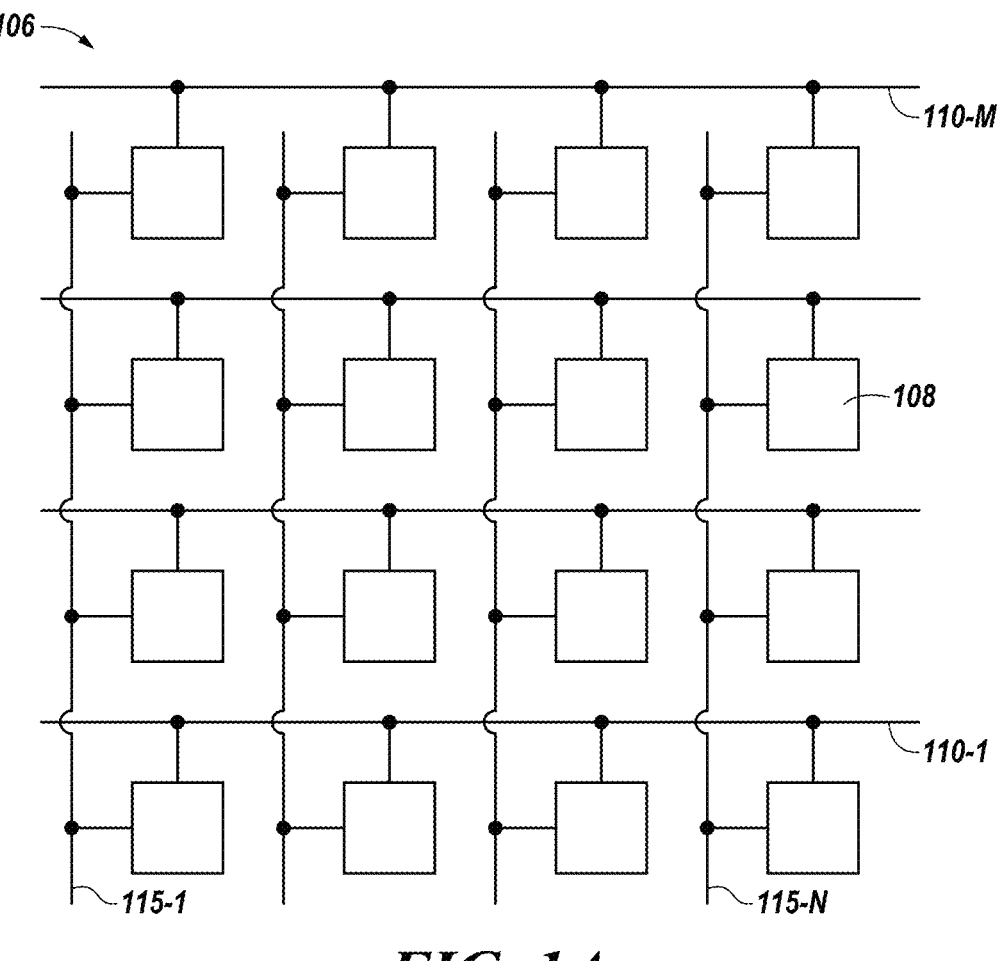
110-M
108
110-1
115-1
115-N
FIG. 1A
120
132
108
128  124
126
130
110
122
112
115
FIG. 1B
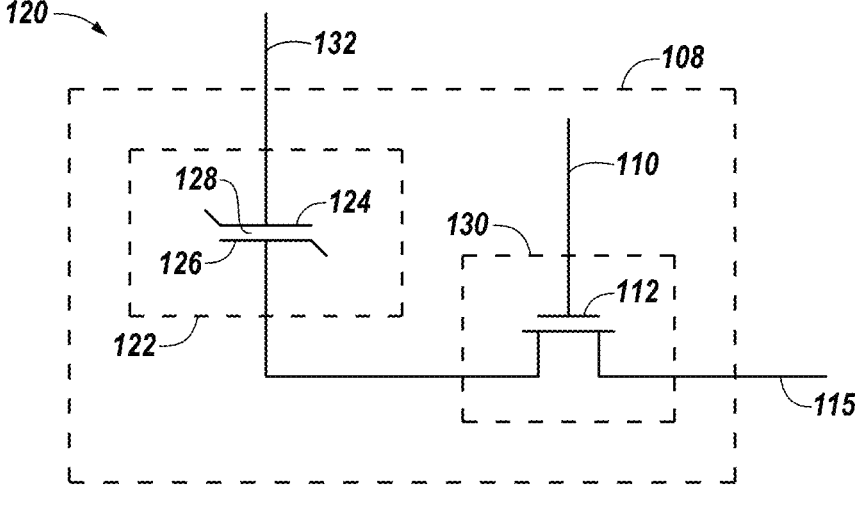

COMPENSATING FOR VOLTAGE OFFSET IN MEMORY

PRIORITY INFORMATION

This application claims the benefit of U.S. Provisional Application No. 63/463,230, filed on May 1, 2023, the contents of which are incorporated herein by reference.

TECHNICAL FIELD

The present disclosure relates generally to semiconductor memory and methods, and more particularly, to compensating for voltage offset in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), ferroelectric random-access memory (FeRAM), resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Memory devices can include memory cells that can store data based on the charge level of a storage element (e.g., a capacitor). Such memory cells can be programmed to store data corresponding to a target data state by varying the charge level of the storage element (e.g., different levels of charge of the capacitor may represent different data sates). For example, sources of an electrical field or energy, such as positive or negative electrical pulses (e.g., positive or negative voltage or current pulses), can be applied to the memory cell (e.g., to the storage element of the cell) for a particular duration to program the cell to a target data state.

A memory cell can be programmed to one of a number of data states. For example, a single level memory cell (SLC) can be programmed to a targeted one of two different data states, which can be represented by the binary units 1 or 0 and can depend on whether the capacitor of the cell is charged or uncharged. As an additional example, some memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

BRIEF DESCRIPTION OF THE DRAWINGS

FIG. 1A illustrates an example of a memory array in accordance with an embodiment of the present disclosure.

FIG. 1B illustrates an example of a memory cell in accordance with an embodiment of the present disclosure.

DETAILED DESCRIPTION

Figure 2:
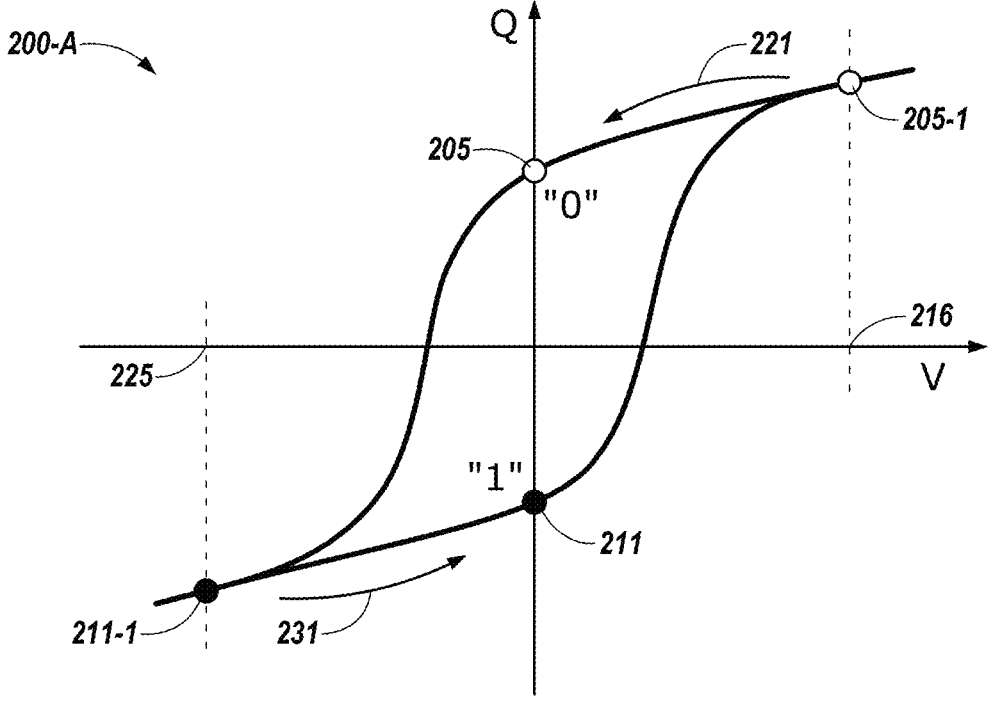
FIG. 2 illustrates an example of hysteresis curves associated with a memory cell in accordance with an embodiment of the present disclosure.
Figure 2:
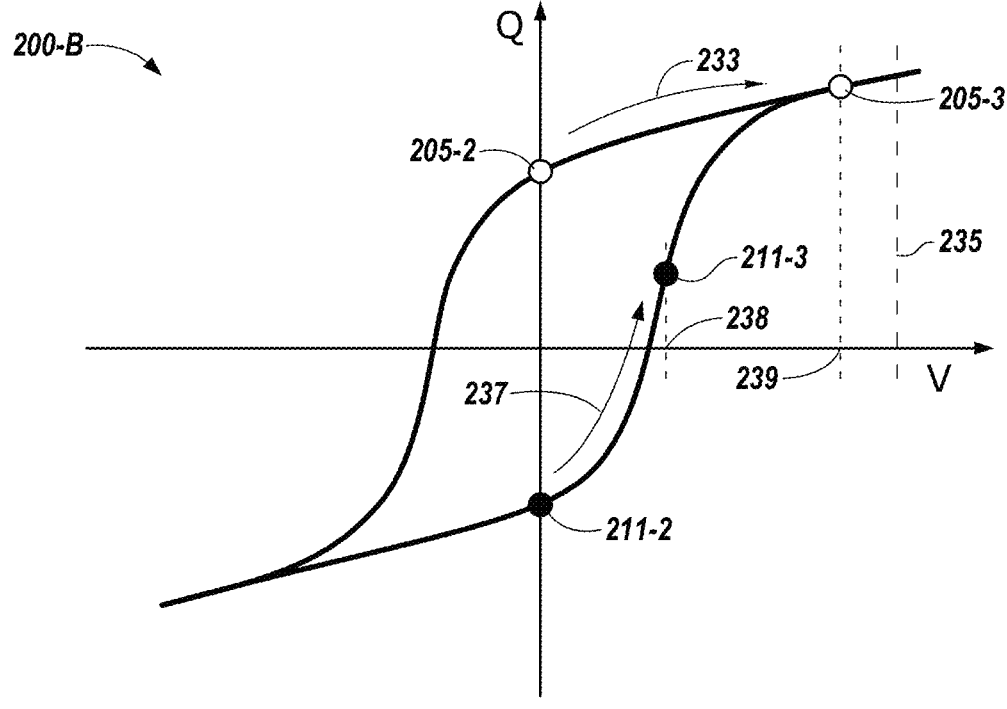

The present disclosure includes apparatuses, methods, and systems for compensating for voltage offset in memory. An embodiment includes a memory having an array of memory cells, and circuitry configured to sense a data state of a memory cell of the array by applying a voltage to a data line coupled to the memory cell and a plate of the memory cell, wherein the voltage applied to the plate is delayed relative to the voltage applied to the data line.

During the sensing of a memory cell, such as an FeRAM cell, a voltage may be applied to a data (e.g., digit) line coupled to the memory cell (which may be referred to herein as a "selected" digit line) and a plate of the memory cell to determine the data state of the cell. After the memory cell has been sensed, the voltage applied to the plate may be decreased (e.g., ramped down), and the cell can be precharged (e.g., the data state can be written back to the memory cell).

When the voltage applied to the plate of the memory cell being sensed is decreased, the voltage on the digit line must also be decreased (e.g., the digit line voltage must follow the plate voltage) to prevent a voltage disturb from occurring on both the access (e.g., word) line coupled to the selected cell (which may be referred to herein as a "selected" word line) and digit lines that are not coupled to the memory cell being sensed (which may be referred to herein as "unselected" digit lines). However, due to the different electrical characteristics (e.g., different inherent resistances and/or capacitances) of the plate and digit line, the digit line voltage may not be able to follow the plate voltage without a delay. Such a delay, which may be referred to herein as a voltage offset between the plate and the digit line, can cause voltage disturb to occur on the selected word line and unselected digit lines. For example, the further the distance (e.g., physical and/or electrical distance) between the unselected digit lines and the plate of the memory cell being sensed, the greater the voltage disturb that may occur. For instance, a voltage disturb of 100 millivolts (mV) or more may occur on the unselected digit lines that are located furthest from the cell plate. Such voltage disturb can adversely affect the performance and/or reliability of the memory.

Embodiments of the present disclosure, however, can compensate for the voltage offset between the plate and digit line (e.g., mitigate the voltage delay between the plate and digit line) by controlling the slew rate of the plate voltage (e.g., ramping the plate voltage down at a slower rate). For example, embodiments of the present disclosure can control the plate voltage slew rate by delaying the voltage applied to the plate relative to the voltage applied to the selected digit line when sensing the memory cell, and/or by applying the voltage to the selected digit line faster than the voltage is applied to the plate when sensing the memory cell. By controlling the slew rate (e.g., ramping speed) of the plate voltage, and thereby compensating for the voltage offset between the plate and digit line, in such a manner, embodiments of the present disclosure can reduce and/or prevent voltage disturb on the selected word line and unselected digit lines, which can improve the performance and/or reliability of the memory.

As used herein, "a" or "an" can refer to one or more of something, and "a plurality of" can refer to more than one of such things. For example, a memory cell can refer to one or more memory cells, and a plurality of memory cells can refer to two or more memory cells. Additionally, the designators "M" and "N" as used herein, particularly with respect to reference numerals in the drawings, indicates that one or more of the particular feature so designated can be included with embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1A illustrates an example of a memory array 106 in accordance with an embodiment of the present disclosure. Memory array 106 can be, for example, a ferroelectric memory (e.g., FeRAM) array.

As shown in FIG. 1A, memory array 106 may include memory cells 108 that may be programmable to store different states. Memory cells 108 can be, for example, FeRAM cells. A memory cell (e.g., a FeRAM cell) 108 may include a capacitor to store a charge representative of the programmable states. For example, a charged and uncharged capacitor may respectively represent two logic states (e.g., 0 and 1). A memory cell 108 may include a capacitor with a ferroelectric material, such as, for instance, an oxide material such as lead zirconate titanate (PZT) in some examples. Additional examples of ferroelectric materials can include barium titanate ($BaTiO_3$), lead titanate ($PbTiO_3$), and strontium bismuth tantalate (SBT). For example, ferroelectric materials may have a non-linear relationship between an applied electric field and stored charge (e.g., in the form of a hysteresis loop, as will be described further in connection with FIG. 2), and may have a spontaneous electric polarization (e.g., a non-zero polarization in the absence of an electric field). Different levels of charge of a ferroelectric capacitor may represent different logic states, for example.

As shown in FIG. 1A, a memory cell 108 may be coupled to a respective access line, such as a respective one of access lines 110-1 to 110-M, and a respective data (e.g., digit) line, such as one of data lines 115-1 to 115-N. For example, a memory cell 108 may be coupled between an access line 110 and a data line 115. In an example, access lines 110 may also be referred to as word lines, and data lines 115 may also be referred to as bit lines. Access lines 110 and data lines 115, for example, may be made of conductive materials, such as copper, aluminum, gold, tungsten, etc., metal alloys, other conductive materials, or the like.

In an example, memory cells 108 commonly coupled to an access line 110 may be referred to as a row of memory cells. For example, access lines 110 may be coupled to a row decoder (not shown in FIG. 1A), and data lines 115 may be coupled to a column decoder (not shown in FIG. 1A). Operations such as programming (e.g., writing) and sensing (e.g., reading) may be performed on memory cells 108 by activating or selecting the appropriate access line 110 and a data line 115 (e.g., by applying a voltage to the access line). Activating an access line 110 may electrically couple the corresponding row of memory cells 108 to their respective data lines 115.

Although not shown in FIG. 1A for clarity and so as not to obscure embodiments of the present disclosure, memory array 106 can be included in an apparatus in the form of a memory device. As used herein, an "apparatus" can refer to, but is not limited to, any of a variety of structures or combinations of structures, such as a circuit or circuitry, a die or dice, a module or modules, a device or devices, or a system or systems, for example. Further, the apparatus (e.g., memory device) may include an additional memory array(s) analogous to array 106.

FIG. 1B illustrates an example circuit 120 that includes a memory cell 108 in accordance with an embodiment of the present disclosure. As shown in FIG. 1B, circuit 120 may include a memory (e.g., FeRAM) cell 108, an access line 110, and a data line 115 that may respectively be examples of a memory cell 108, an access line 110, and a data line 115, shown in FIG. 1A.

As shown in FIG. 1B, memory cell 108 may include a storage element, such as a capacitor 122, that may have a first plate, such as a cell plate 124, and a second plate, such as a cell bottom 126. Cell plate 124 and cell bottom 126 may be capacitively coupled through a ferroelectric material 128 positioned between them. The orientation of cell plate 124 and cell bottom 126 may be flipped without changing the operation of memory cell 108.

As shown in FIG. 1B, circuit 120 may include a select device 130, such as a select transistor. For example, the control gate 112 of select device 130 may be coupled to access line 110. In the example of FIG. 1B, cell plate 124 may be accessed via plate line 132, and cell bottom 126 may be accessed via data line 115. For example, select device 130 may be used to selectively couple data line 115 to cell bottom 126 in response to access line 110 activating select device 130. For example, capacitor 122 may be electrically isolated from data line 115 when select device 130 is deactivated, and capacitor 122 may be electrically coupled to data line 115 when select device 130 is activated. Activating select device 130 may be referred to as selecting memory cell 108, for example.

In an example, sources of an electric field or energy, such as positive or negative electrical pulses (e.g., positive or negative voltage or current pulses), can be applied to the storage element of memory cell 108 (e.g., to capacitor 122) for a particular duration to program the cell to a target data state. For instance, when the electric field (e.g., the electrical pulses) is applied across the ferroelectric material 128 of capacitor 122, the dipoles of ferroelectric material 128 may align in the direction of the applied electric field. The dipoles may retain their alignment (e.g., polarization state) after the electric field is removed, and different logic states (e.g., 0 and 1) may be stored as the different polarization states of the ferroelectric material 128. Accordingly, memory cell 108 may be programmed by charging cell plate 124 and cell bottom 126, which may apply an electric field across ferro-electric material 128 and place the ferroelectric material in a particular polarization state (e.g., depending on the polarity of the applied field) that may correspond to a particular data (e.g., logic) state. The data state of the memory cell may subsequently be determined (e.g., sensed) by determining which polarization state the ferroelectric material is in. Examples of programming and sensing the memory cell will be further described herein.

FIG. 2 illustrates an example of hysteresis curves (e.g., loops) 200-A and 200-B associated with a memory cell in accordance with an embodiment of the present disclosure. The memory cell can be, for example, a ferroelectric memory (e.g., FeRAM) cell, such as, for instance, memory cell 108 previously described in connection with FIGS. 1A-1B.

Hysteresis curves 200-A and 200-B illustrate an example ferroelectric memory cell writing and reading process, respectively. Hysteresis curves 200-A and 200-B depict the charge (Q) stored on a ferroelectric capacitor (e.g., capacitor 122 previously described in connection with FIG. 1B) as a function of voltage difference (V).

Hysteresis curves 200-A and 200-B may be understood from the perspective of a single terminal of a capacitor. For example, if the ferroelectric material has a negative polarization, positive charge accumulates at the terminal, and if the ferroelectric material has a positive polarization, negative change accumulates at the terminal. Additionally, it should be understood that the voltages in hysteresis curves 200-A and 200-B represent a voltage difference across the capacitor and are directional. For example, a positive voltage may be realized by applying a positive voltage to the terminal in question (e.g., cell plate 124 previously described in connection with FIG. 1B) and maintaining the second terminal (e.g., cell bottom 126 previously described in connection with FIG. 1B) at ground (e.g., at approximately 0 Volts). A negative voltage may be applied by maintaining the terminal in question at ground and applying a positive voltage to the second terminal (e.g., positive voltages may be applied to negatively polarize the terminal in question). Similarly, two positive voltages, two negative voltages, or any combination of positive and negative voltages may be applied to the appropriate capacitor terminals to generate the voltage difference shown in hysteresis curves 200-A and 200-B.

As shown in hysteresis curve 200-A, the ferroelectric material may maintain a positive or negative polarization with a zero voltage difference, resulting in two possible charged states: charge state 205 and charge state 211. In the example illustrated in FIG. 2, charge state 205 represents a logic 0 and charge state 211 represents a logic 1. In some examples, the logic values of the respective charge states may be reversed.

A logic 0 or 1 may be written to the memory cell by controlling the electric polarization of the ferroelectric material, and thus the charge on the capacitor terminals. For example, applying a net positive voltage 216 across the capacitor results in charge accumulation until charge state 205-1 is reached. Upon removing voltage 216, charge state 205-1 follows path 221 until it reaches charge state 205 at zero voltage. Similarly, charge state 211 is written by applying a net negative voltage 225, which results in charge state 211-1. After removing negative voltage 225, charge state 211-1 follows path 231 until it reaches charge state 211 at zero voltage. Charge states 205-1 and 211-1 may be referred to as the remnant polarization (Pr) values (e.g., the polarization (or charge) that remains upon removing the external bias). The coercive voltage is the voltage at which the charge (or polarization) is zero.

To sense (e.g., read) the stored state of the ferroelectric capacitor, a voltage may be applied across the capacitor. In response, the stored charge (Q) changes, and the degree of the change depends on the initial charge state (e.g., the final stored charge (Q) depends on whether charge state 205-2 or 211-2 was initially stored). For example, hysteresis curve 200-B illustrates two possible stored charge states 205-2 and 211-2. Voltage 235 may be applied across the capacitor. In other cases, a fixed voltage may be applied to the cell plate and, although depicted as a positive voltage, voltage 235 may be negative. In response to voltage 235, charge state 205-2 may follow path 233. Likewise, if charge state 211-2 was initially stored, then it follows path 237. The final position of charge state 205-3 and charge state 211-3 depend on a number of factors, including the specific sensing scheme and circuitry, for example.

By comparing the voltage on the digit line coupled to the memory cell (e.g., as measured by a sense component) to a reference voltage, the initial state of the capacitor may be determined. The digit line voltage may be the difference between voltage 235 and the final voltage across the capacitor, voltage 238 or voltage 239 (e.g., voltage 235-voltage 238 or voltage 235-voltage 239). A reference voltage may be generated such that its magnitude is between the two possible voltages of the two possible digit line voltages in order to determine the stored logic state (e.g., if the digit line voltage is higher or lower than the reference voltage). For example, the reference voltage may be the average of the two quantities voltage 235-voltage 238 and voltage 235-voltage 239. Upon comparison by the sense component, the sensed digit line voltage may be determined to be higher or lower than the reference voltage, and the stored logic value of the ferroelectric memory cell (e.g., a logic 0 or 1) may be determined.

Figure 3A:
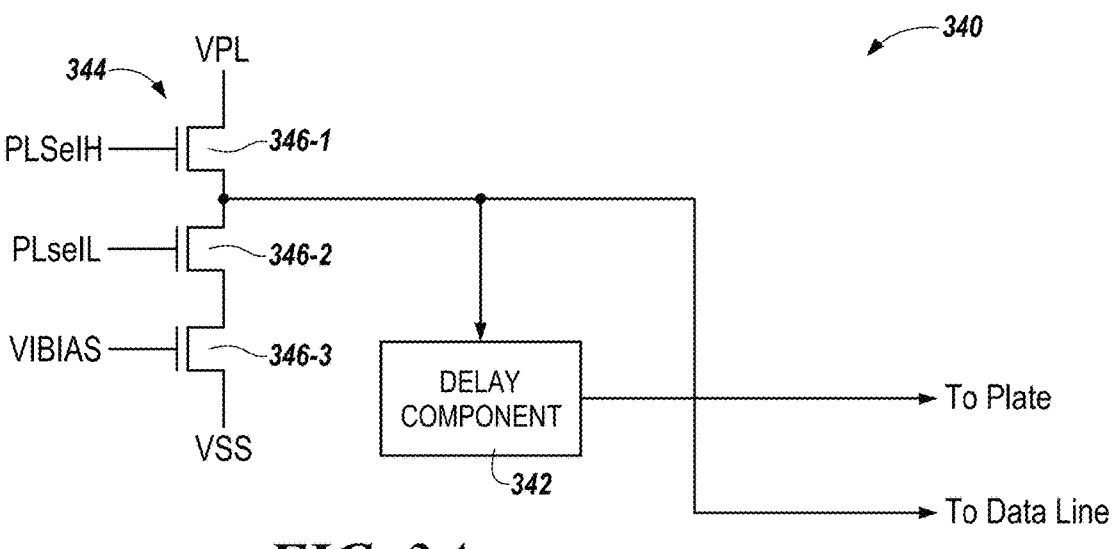
FIGS. 3A-3B illustrate examples of circuitry for compensating for voltage offset in memory in accordance with an embodiment of the present disclosure.
Figure 3B:
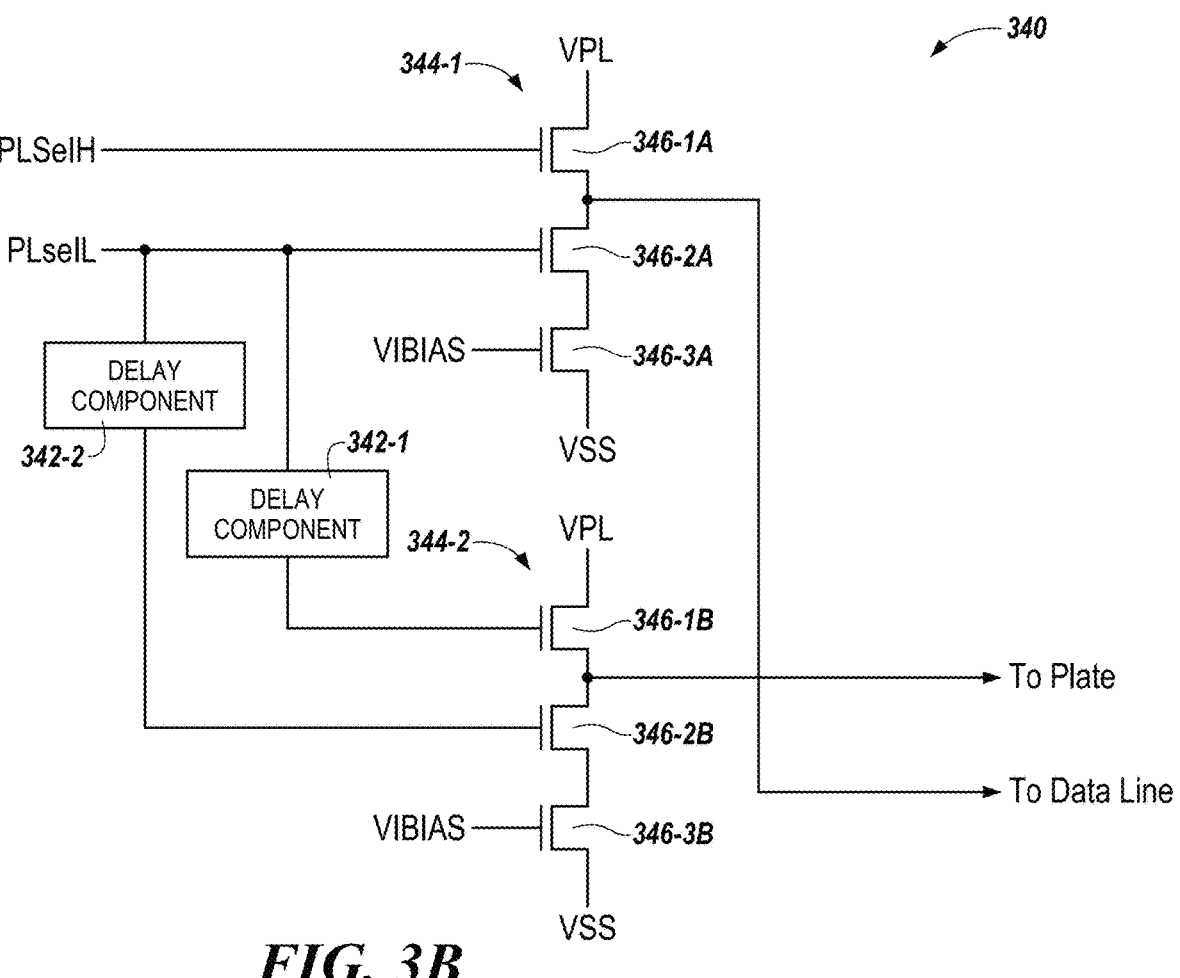

FIGS. 3A-3B illustrate examples of circuitry 340 for compensating for voltage offset in memory in accordance with an embodiment of the present disclosure. Circuitry 340 can be coupled to, and included in, the same apparatus (e.g., memory device) as memory array 106 previously described in connection with FIGS. 1A-1B. For example, circuitry 340 can be coupled to an array that includes memory cells that are analogous to memory cells 108 previously described in connection with FIGS. 1A-1B.

Further, although not shown in FIGS. 3A and 3B for simplicity and so as not to obscure embodiments of the present disclosure, circuitry 340 can be coupled to a controller. The controller can include, for example, control circuitry and/or logic (e.g., hardware and/or firmware), and can be included on the same physical device (e.g., the same die) as the memory array, or can be included on a separate physical device that is communicatively coupled to the physical device that includes the memory array. In an embodiment, components of the controller can be spread across multiple physical devices (e.g., some components on the same die as the array, and some components on a different die, module, or board).

The controller can operate circuitry 340 to compensate for voltage offset that may occur while sensing of the data states of the memory cells of the array. For example, while sensing the data state of a memory cell of the array, the controller can operate circuitry 340 to apply a supply voltage to a data (e.g., digit) line coupled to the memory cell and a plate of the memory cell, wherein the voltage applied to the plate is delayed relative to the voltage applied to the data line. The data line can be, for instance, data line 115 previously described in connection with FIGS. 1A-1B, and the plate can be, for instance, cell plate 124 previously described in connection with FIG. 1B.

For instance, in the example illustrated in FIG. 3A, circuitry 340 includes a single driver (e.g., plate driver) 344 to apply the supply voltage to the data line and the plate. As shown in FIG. 3A, driver 344 includes transistors 346-1, 346-2, and 346-3, which can be, for instance, metal-oxide-semiconductor field effect transistors (MOSFETs) (e.g., n-type MOSFETs). Upon providing a first voltage (e.g., VPL) to the drain of transistor 346-1, a second voltage (e.g., VIBIAS) to the gate of transistor 346-3, a third voltage (e.g., VSS) to the source of transistor 346-3, and selection signals (e.g., PLSelH and PLSelL) to the gates of transistors 346-1 and 346-2, respectively, the supply voltage can be output from driver 344 to the data line and plate, as illustrated in FIG. 3A.

In the example illustrated in FIG. 3A, circuitry 340 includes a single delay component 342 coupled to (e.g. in series with) the output of driver 344 and the plate (e.g., but not coupled to the data line) to delay the voltage applied to the plate. Delay component 342 can be, for example, a resistor-capacitor (RC) component (e.g., an RC circuit). As an additional example, delay component 432 can be a switch.

In the example illustrated in FIG. 3B, circuitry 340 includes a first driver (e.g., plate driver) 344-1 to apply the supply voltage to the data line, and a second driver 344-2 to apply the supply voltage to the plate. As shown in FIG. 3B, driver 344-1 includes transistors 346-1A, 346-2A, and 346-3A, and driver 344-2 includes transistors 346-1B, 346-2B, and 346-3B, which can be, for instance, MOSFETs (e.g., n-type MOSFETs). Upon providing a first voltage (e.g., VPL) to the drains of transistors 346-1A and 346-1B, a second voltage (e.g., VIBIAS) to the gates of transistors 346-3A and 346-3B, a third voltage (e.g., VSS) to the sources of transistors 346-3A and 346-3B, a first selection signal (e.g., PLSelH) to the gate of transistor 346-1A, and a second selection signal (e.g., PLSelL) to the gates of transistors 346-2A, 346-1B, and 346-2B, the supply voltage can be output from driver 344-1 to the data line and from driver 344-2 to the plate, as illustrated in FIG. 3B.

In the example illustrated in FIG. 3B, circuitry 340 includes a first delay component 342-1 coupled to (e.g., in series with) the second selection signal and the gate of transistor 346-1B and a second delay component 342-2 coupled to (e.g., in series with) the second selection signal and the gate of transistor 346-2B to delay the voltage applied to the plate. Delay components 342-1 and 342-2 can be, for example, RC components (e.g., RC circuits) or switches.

During the sensing of the data state of the memory cell, an additional voltage can be applied to an access (e.g., word) line coupled to the memory cell while the supply voltage is applied to the data line and the plate. The access line can be, for instance, access line 110 previously described in connection with FIGS. 1A-1B. The magnitude of the additional voltage can be greater than the magnitude of the supply voltage. For instance, the magnitude of the additional voltage can be 3.0 Volts (V) (e.g., the magnitude of the supply voltage can be less than 3.0 V).

The data state of the memory cell can be determined (e.g., sensed) based on the voltage on the data line coupled to the memory cell in response to applying the supply voltage and the additional voltage, as previously described herein. For instance, a sense component (e.g., a sense amplifier; not shown in FIGS. 3A and 3B for simplicity and so as not to obscure embodiments of the present disclosure) can be coupled to the array and used to determine the data state of the memory cell, as previously described herein.

After the data state of the memory cell has been sensed, the voltage applied to the plate of the cell can be decreased (e.g., ramped down). Because the supply voltage applied to the plate was delayed relative to the voltage applied to the data line coupled to the memory cell by circuitry 340, the plate voltage can be decreased at a slower rate than in previous memory cell sensing approaches (e.g., approaches in which the supply voltage applied to the plate is not delayed), which can compensate for a voltage offset between the plate and the digit line. An example further illustrating such voltage offset compensation will be further described herein (e.g., in connection with FIG. 4).

After the voltage applied to the plate of the cell has been decreased, the memory cell can be pre-charged (e.g., the sensed data state can be written back to the cell) by applying an additional voltage to the access line coupled to the memory cell. The additional voltage can be, for instance, the additional voltage applied to the access line while the data state of the memory cell was being sensed (e.g., the additional voltage that was applied to the access line while sensing the data state of the cell can continue to be applied to the access line after the data state has been sensed to pre-charge the cell).

Figure 4:
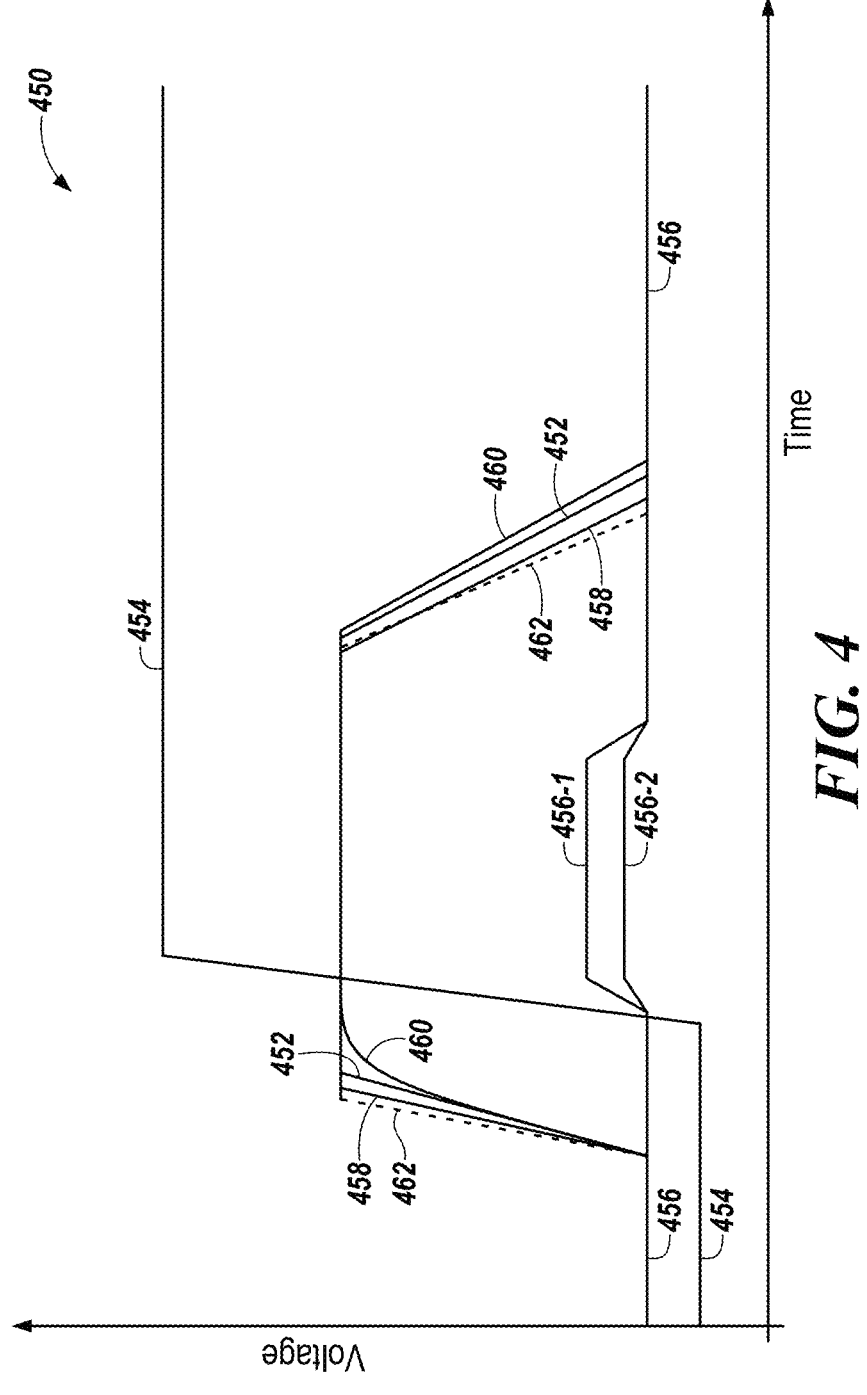
FIG. 4 illustrates an example of a timing diagram associated with compensating for voltage offset in memory in accordance with an embodiment of the present disclosure.

FIG. 4 illustrates an example of a timing diagram 450 associated with compensating for voltage offset in memory in accordance with an embodiment of the present disclosure. The memory can comprise, for example, an array of memory cells 108 previously described in connection with FIGS. 1A-1B.

As shown in FIG. 4, timing diagram 450 includes waveforms 452, 454, 456, 458, and 460. Waveform 452 represents a voltage signal (e.g., pulse) applied to a plate (e.g., plate 124 previously described in connection with FIG. 1B) of a memory cell whose data state is being sensed during a sense operation, and waveform 454 represents a voltage signal applied to an access (e.g., word) line (e.g., access line 110 previously described in connection with FIGS. 1A-1B) coupled to the memory cell (e.g., a selected access line) during the sense operation. The voltage signal applied to the plate can be delayed, as previously described herein. The voltage signal applied to the selected access line can have a magnitude of, for example, 3.0 V, and can have a magnitude greater than the voltage signal applied to the plate, as illustrated in FIG. 4. Further, the plate voltage signal can begin to be applied to the plate before the access line voltage signal begins to be applied to the selected access line, and can continue to be applied to the plate while the access line voltage signal is applied to the selected access line, as illustrated in FIG. 4.

Waveform 456 represents a voltage signal on a data (e.g., digit) line (e.g., data line 115 previously described in connection with FIGS. 1A-1B) coupled to the memory cell (e.g., a selected data line) in response to the voltage signals being applied to the plate and the selected access line. The voltage signal on the selected data line can be used to determine (e.g., sense) the data state of the memory cell, as previously described herein. For instance, in the example illustrated in FIG. 4, waveform 456-1 represents the voltage signal on the selected data line if the data state of the memory cell is a logic 1, and waveform 456-2 represents the voltage signal on the selected data line if the data state of the memory cell is a logic 0.

Waveforms 458 and 460 represent voltage signals on data lines (e.g., data lines 115) of the array that are not coupled to the memory cell whose data state is being sensed during the sense operation (e.g., unselected data lines). For instance, waveform 458 represents a voltage signal on an unselected data line that is near (e.g., physically and/or electrically near) the memory cell, and waveform 460 represents a voltage signal on an unselected data line that is far (e.g., physically and/or electrically far) from the memory cell.

After the data state of the memory cell has been sensed, the voltage signal applied to the cell plate can be decreased (e.g., ramped down), and the voltage signals on the unselected data lines can also decrease (e.g., ramp down), as illustrated in FIG. 4. Because the voltage signal applied to the cell plate has been delayed, as previously described herein, the cell plate voltage signal ramps down between the voltage signals on the near and far unselected data lines as they ramp down (e.g., waveform 452 is between waveforms 458 and 460 as they ramp down), as illustrated in FIG. 4. As such, the voltage disturb on the unselected data lines can be balanced (e.g., the voltage disturb on the near and far unselected data lines can be about the same), which can reduce the voltage disturb that may occur on the far unselected data line. For instance, the voltage disturb on the far unselected data line may be below 100 mV.

In contrast, dashed line waveform 462 represents a voltage signal applied to the plate of the memory cell if the voltage signal was not delayed. Such an un-delayed voltage signal would increase (e.g., ramp up) and decrease (e.g., ramp down) at a faster rate than the delayed voltage signal represented by waveform 452, as illustrated in FIG. 4. For instance, such an un-delayed voltage signal would ramp down faster than the voltage signals on the near and far unselected data lines (e.g., waveform 462 is to the left of both waveforms 458 and 460 as they ramp down), as illustrated in FIG. 4. Accordingly, such an un-delayed voltage signal would cause the voltage disturb on the unselected data lines to be unbalanced (e.g., the voltage disturb on the far unselected data line would be greater than the voltage disturb on the near unselected data line), which would result in a greater voltage disturb occurring on the far unselected data line. For instance, the voltage disturb on the far unselected data line caused by such an un-delayed voltage signal may be greater than 100 mV.

As shown in FIG. 4, the access line voltage signal can continue to be applied to the selected access line after the cell plate voltage signal has been ramped down. Continuing to apply the access line voltage signal to the selected access line can pre-charge the memory cell, as previously described herein.

Figure 5:
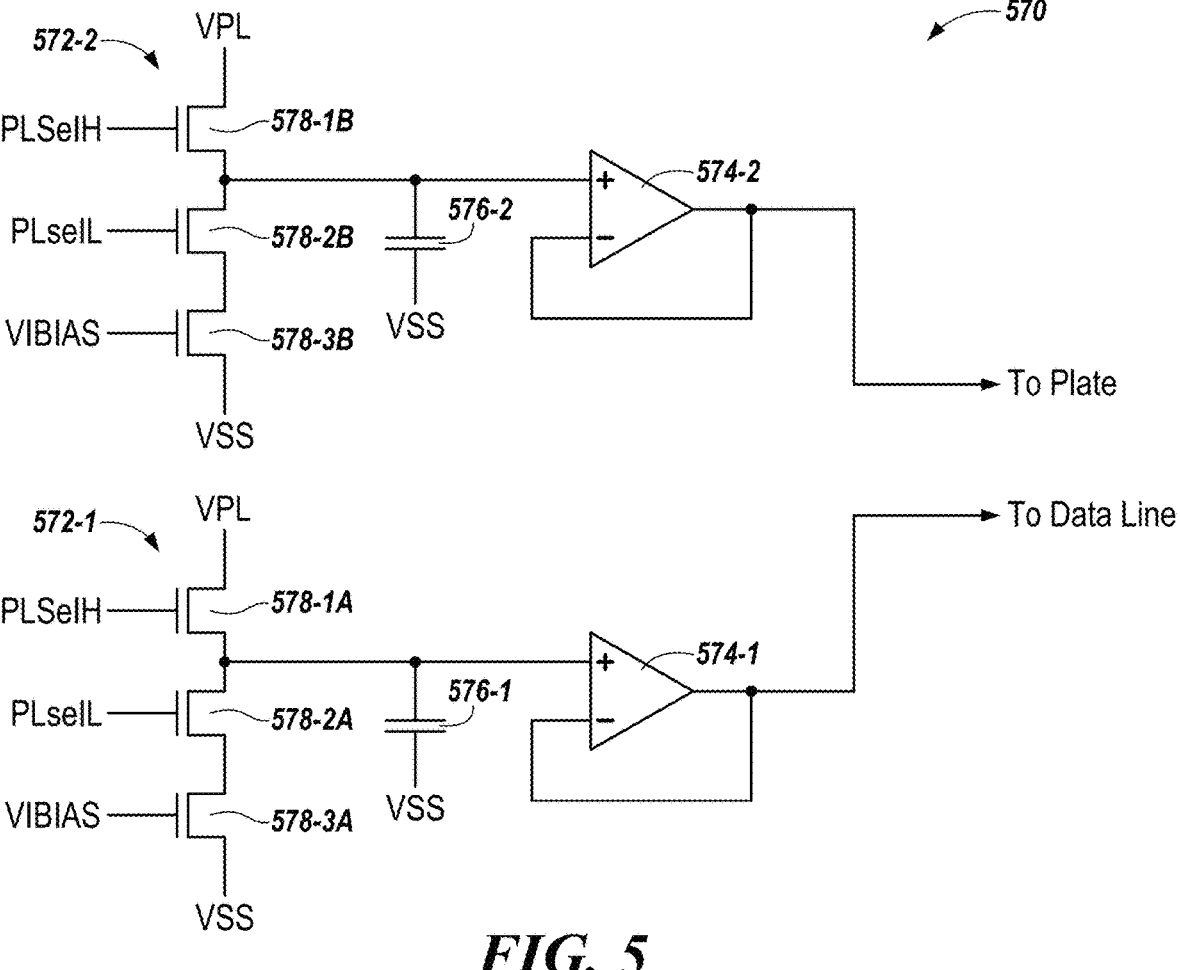
FIG. 5 illustrates an example of circuitry for compensating for voltage offset in memory in accordance with an embodiment of the present disclosure.

FIG. 5 illustrates an example of circuitry 570 for compensating for voltage offset in memory in accordance with an embodiment of the present disclosure. Circuitry 570 can be coupled to, and included in, the same apparatus (e.g., memory device) as memory array 106 previously described in connection with FIGS. 1A-1B. For example, circuitry 570 can be coupled to an array that includes memory cells that are analogous to memory cells 108 previously described in connection with FIGS. 1A-1B.

Further, although not shown in FIG. 5 for simplicity and so as not to obscure embodiments of the present disclosure, circuitry 570 can be coupled to a controller. The controller can include, for example, control circuitry and/or logic (e.g., hardware and/or firmware), and can be included on the same physical device (e.g., the same die) as the memory array, or can be included on a separate physical device that is communicatively coupled to the physical device that includes the memory array. In an embodiment, components of the controller can be spread across multiple physical devices (e.g., some components on the same die as the array, and some components on a different die, module, or board).

The controller can operate circuitry 570 to compensate for voltage offset that may occur while sensing of the data states of the memory cells of the array. For example, while sensing the data state of a memory cell of the array, the controller can operate circuitry 570 to apply a supply voltage to a data (e.g., digit) line coupled to the memory cell and a plate of the memory cell, wherein the supply voltage is applied to the data line faster than the supply voltage is applied to the plate. The data line can be, for instance, data line 115 previously described in connection with FIGS. 1A-1B, and the plate can be, for instance, cell plate 124 previously described in connection with FIG. 1B.

For instance, in the example illustrated in FIG. 5, circuitry 570 includes a first driver (e.g., plate driver) 572-1 to apply the supply voltage to the data line, and a second driver 572-2 to apply the supply voltage to the plate. As shown in FIG. 5, driver 572-1 includes transistors 578-1A, 578-2A, and 578-3A, and driver 572-2 includes transistors 578-1B, 578-2B, and 578-3B, which can be, for instance, MOSFETs (e.g., n-type MOSFETs). Upon providing a voltage (e.g., VPL) to the drains of transistors 578-1A and 578-1B, a voltage (e.g., VIBIAS) to the gates of transistors 578-3A and 578-3B, a voltage (e.g., VSS) to the sources of transistors 578-3A and 578-3B, a first selection signal (e.g., PLSelH) to the gates of transistor 578-1A and 578-1B, and a second selection signal (e.g., PLSelL) to the gates of transistors 578-2A and 578-2B, the supply voltage can be output from driver 572-1 to the data line and from driver 572-2 to the plate, as illustrated in FIG. 5.

For instance, in the example illustrated in FIG. 5, circuitry 570 includes a first voltage buffer 574-1 coupled to the data line and the output of driver 572-1, and a second voltage buffer 574-2 coupled to the plate and the output of driver 572-2. The supply voltage can be output from driver 572-1 to the data line via voltage buffer 574-1, and the supply voltage can be output from driver 572-2 to the plate via voltage buffer 574-2, as illustrated in FIG. 5. Further, circuitry 570 includes a first capacitor 576-1 coupled to an input (e.g., the non-inverting input) of voltage buffer 574-1 and the output of driver 572-1, a second capacitor 576-2 coupled to an input (e.g., the non-inverting input) of voltage buffer 574-1 and the output of driver 572-2, as illustrated in FIG. 5. Capacitors 576-1 and 576-2 can be charged by applying a voltage (e.g., VSS) thereto, as illustrated in FIG. 5.

In an example, the magnitude of the voltage (e.g., VIBIAS) provided to the gate of transistor 578-3A of driver 572-1 can be greater than the magnitude of the voltage (e.g. VIBIAS) provided to the gate of transistor 578-3B of driver 572-2 to apply the supply voltage to the data line faster than the supply voltage is applied to the plate. For instance, the magnitude of the voltage provided to the gate of transistor 578-3A can be 1.2 times greater than the magnitude of the voltage provided to the gate of transistor 578-3B. However, embodiments are not limited to this example.

In an example, the capacitance of capacitor 576-1 can be less than the capacitance of capacitor 576-2 to apply the supply voltage to the data line faster than the supply voltage is applied to the plate. For instance, the capacitance of capacitor 576-1 can be 0.7 times the capacitance of capacitor 576-2. However, embodiments are not limited to this example.

In an example, the voltage (e.g., VSS) provided to the source of transistor 578-3A of driver 572-1 can be less than the voltage (e.g., VSS) provided to the source of transistor 578-3B of driver 572-2 to apply the supply voltage to the data line faster than the supply voltage is applied to the plate. For instance, the voltage provided to the source of transistor 578-3A can be a negative voltage, and the voltage provided to the source of transistor 578-3B can be a positive voltage. However, embodiments are not limited to this example.

During the sensing of the data state of the memory cell, an additional voltage can be applied to an access (e.g., word) line coupled to the memory cell while the supply voltage is applied to the data line and the plate, as previously described herein (e.g., in connection with FIGS. 3A-3B). The data state of the memory cell can be determined (e.g., sensed) based on the voltage on the data line coupled to the memory cell in response to applying the supply voltage and the additional voltage, as previously described herein. For instance, a sense component (e.g., a sense amplifier; not shown in FIG. 5 for simplicity and so as not to obscure embodiments of the present disclosure) can be coupled to the array and used to determine the data state of the memory cell, as previously described herein.

After the data state of the memory cell has been sensed, the voltage applied to the plate of the cell can be decreased (e.g., ramped down). Because the supply voltage was applied to the plate of the memory cell faster than the supply voltage was applied to the data line coupled to the memory cell by circuitry 340, the plate voltage can be decreased at a slower rate than in previous memory cell sensing approaches (e.g., approaches in which the supply voltage is applied to the plate and the data line at the same rate), which can compensate for a voltage offset between the plate and the digit line. An example further illustrating such voltage offset compensation will be further described herein (e.g., in connection with FIG. 6). After the voltage applied to the plate of the cell has been decreased, the memory cell can be pre-charged by applying an additional voltage to the access line coupled to the memory cell, as previously described herein (e.g., in connection with FIGS. 3A-3B).

Figure 6:
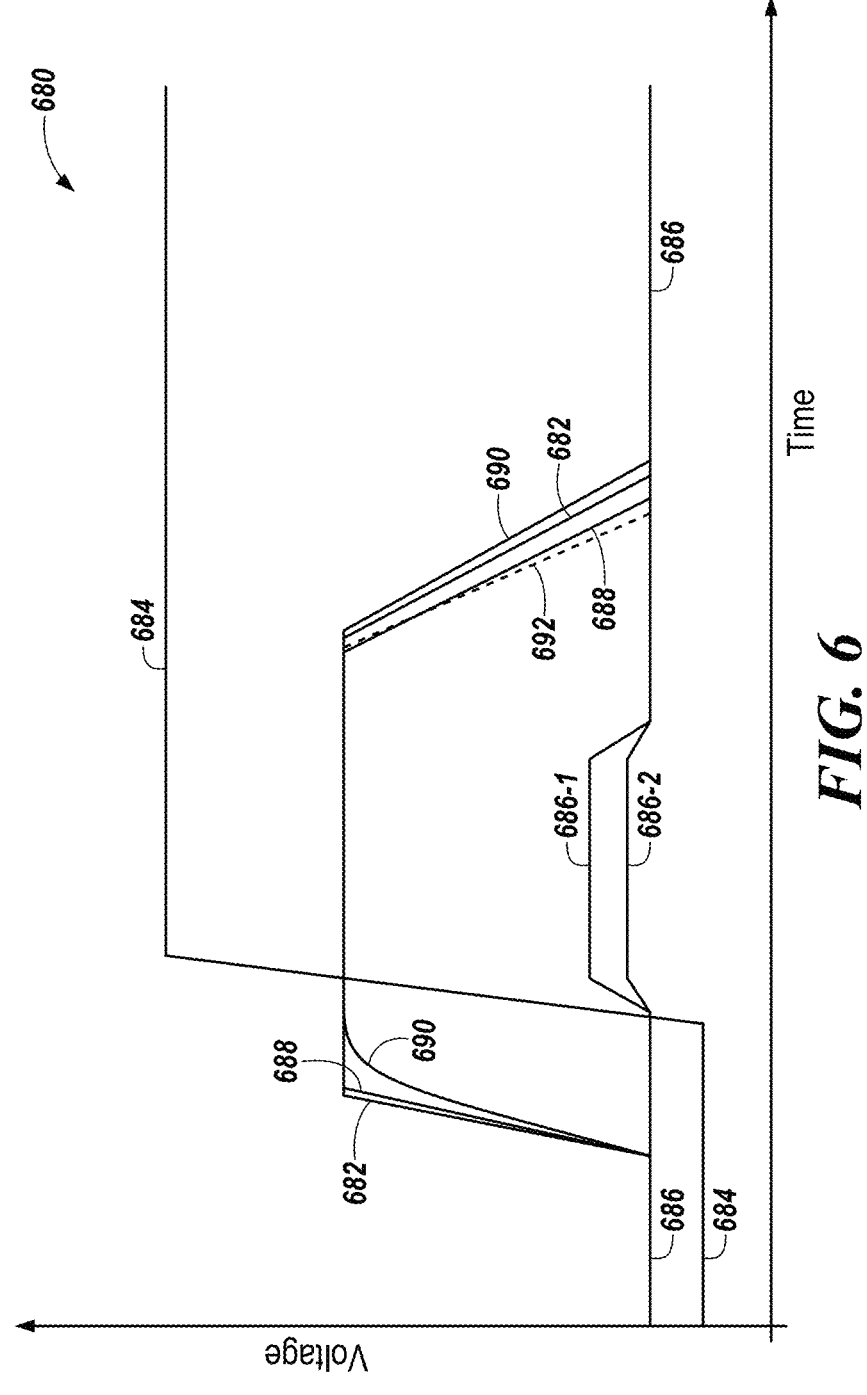
FIG. 6 illustrates an example of a timing diagram associated with compensating for voltage offset in memory in accordance with an embodiment of the present disclosure.

FIG. 6 illustrates an example of a timing diagram 680 associated with compensating for voltage offset in memory in accordance with an embodiment of the present disclosure. The memory can comprise, for example, an array of memory cells 108 previously described in connection with FIGS. 1A-1B.

As shown in FIG. 6, timing diagram 680 includes waveforms 682, 684, 686, 688, and 690. Waveform 682 represents a voltage signal (e.g., pulse) applied to a plate (e.g., plate 124 previously described in connection with FIG. 1B) of a memory cell whose data state is being sensed during a sense operation, and waveform 684 represents a voltage signal applied to an access (e.g., word) line (e.g., access line 110 previously described in connection with FIGS. 1A-1B) coupled to the memory cell (e.g., a selected access line) during the sense operation. The voltage signal can be applied to the plate slower than a voltage applied to a data (e.g. digit) line coupled to the memory cell (e.g., the voltage can be applied to the data line faster than the voltage is applied to the plate), as previously described herein. The voltage signal applied to the selected access line can have a magnitude of, for example, 3.0 V, and can have a magnitude greater than the voltage signal applied to the plate, as illustrated in FIG. 6. Further, the plate voltage signal can begin to be applied to the plate before the access line voltage signal begins to be applied to the selected access line, and can continue to be applied to the plate while the access line voltage signal is applied to the selected access line, as illustrated in FIG. 6.

Waveform 686 represents a voltage signal on the data line (e.g., data line 115 previously described in connection with FIGS. 1A-1B) coupled to the memory cell (e.g., a selected data line) in response to the voltage signals being applied to the plate and the selected access line. The voltage signal on the selected data line can be used to determine (e.g., sense) the data state of the memory cell, as previously described herein. For instance, in the example illustrated in FIG. 6, waveform 686-1 represents the voltage signal on the selected data line if the data state of the memory cell is a logic 1, and waveform 686-2 represents the voltage signal on the selected data line if the data state of the memory cell is a logic 0.

Waveforms 668 and 690 represent voltage signals on data lines (e.g., data lines 115) of the array that are not coupled to the memory cell whose data state is being sensed during the sense operation (e.g., unselected data lines). For instance, waveform 668 represents a voltage signal on an unselected data line that is near (e.g., physically and/or electrically near) the memory cell, and waveform 690 represents a voltage signal on an unselected data line that is far (e.g., physically and/or electrically far) from the memory cell.

After the data state of the memory cell has been sensed, the voltage signal applied to the cell plate can be decreased (e.g., ramped down), and the voltage signals on the unselected data lines can also decrease (e.g., ramp down), as illustrated in FIG. 6. Because the voltage signal applied to the cell plate has been applied slower than the voltage applied to the selected data line, as previously described herein, the cell plate voltage signal ramps down between the voltage signals on the near and far unselected data lines as they ramp down (e.g., waveform 682 is between waveforms 688 and 690 as they ramp down), as illustrated in FIG. 6. As such, the voltage disturb on the unselected data lines can be balanced (e.g., the voltage disturb on the near and far unselected data lines can be about the same), which can reduce the voltage disturb that may occur on the far unselected data line. For instance, the voltage disturb on the far unselected data line may be below 100 mV.

In contrast, dashed line waveform 692 represents a voltage signal applied to the plate of the memory cell if the voltage signal was not applied slower than the voltage applied to the selected data line. Such a voltage signal would decrease (e.g., ramp down) at a faster rate than the voltage signal represented by waveform 682, as illustrated in FIG. 6. For instance, such a voltage signal would ramp down faster than the voltage signals on the near and far unselected data lines (e.g., waveform 692 is to the left of both waveforms 688 and 690 as they ramp down), as illustrated in FIG. 6. Accordingly, such a voltage signal would cause the voltage disturb on the unselected data lines to be unbalanced (e.g., the voltage disturb on the far unselected data line would be greater than the voltage disturb on the near unselected data line), which would result in a greater voltage disturb occurring on the far unselected data line. For instance, the voltage disturb on the far unselected data line caused by such an un-delayed voltage signal may be greater than 100 mV.

As shown in FIG. 6, the access line voltage signal can continue to be applied to the selected access line after the cell plate voltage signal has been ramped down. Continuing to apply the access line voltage signal to the selected access line can pre-charge the memory cell, as previously described herein.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory having an array of memory cells; and
circuitry configured to sense a data state of a memory cell of the array by applying a voltage to a data line coupled to the memory cell and a plate of the memory cell, wherein the voltage applied to the plate is delayed relative to the voltage applied to the data line.

2. The apparatus of claim 1, wherein the circuitry includes a resistor-capacitor (RC) component to delay the voltage applied to the plate.

3. The apparatus of claim 1, wherein the circuitry includes a switch to delay the voltage applied to the plate.

4. The apparatus of claim 1, wherein the circuitry includes a driver to apply the voltage to the data line and the plate.

5. The apparatus of claim 4, wherein the circuitry includes a delay component coupled to the plate and an output of the driver to delay the voltage applied to the plate.

6. The apparatus of claim 1, wherein the circuitry includes:
a first driver to apply the voltage to the data line;
a second driver to apply the voltage to the plate;
a first delay component coupled to a first transistor of the second driver; and
a second delay component coupled to a second transistor of the second driver;
wherein the first delay component and the second delay component are configured to delay the voltage applied to the plate.

7. A method of operating memory, comprising:
sensing a data state of a ferroelectric memory cell by applying a voltage to a data line coupled to the ferroelectric memory cell and a plate of the ferroelectric memory cell, wherein the voltage applied to the plate is delayed relative to the voltage applied to the data line; and
decreasing the voltage applied to the plate after sensing the data state of the ferroelectric memory cell.

8. The method of claim 7, wherein the method includes pre-charging the ferroelectric memory cell after decreasing the voltage applied to the plate.

9. The method of claim 8, wherein pre-charging the ferroelectric memory cell includes applying an additional voltage to an access line coupled to the ferroelectric memory cell.

10. The method of claim 7, wherein the method includes sensing the data state of the ferroelectric memory cell by applying an additional voltage to an access line coupled to the ferroelectric memory cell while applying the voltage to the data line and the plate.

11. The method of claim 10, wherein a magnitude of the additional voltage is greater than a magnitude of the voltage.

12. An apparatus, comprising:
a memory having an array of memory cells; and
circuitry configured to sense a data state of a memory cell of the array by applying a voltage to a data line coupled to the memory cell and a plate of the memory cell, wherein the voltage is applied to the data line faster than the voltage is applied to the plate.

13. The apparatus of claim 12, wherein the memory cells of the array are ferroelectric memory cells.

14. The apparatus of claim 12, wherein the circuitry is configured to decrease the voltage applied to the plate after sensing the data state of the memory cell.

15. The apparatus of claim 12, wherein the circuitry includes:
a first driver to apply the voltage to the data line;
a second driver to apply the voltage to the plate.

16. The apparatus of claim 15, wherein the circuitry includes:
a first buffer coupled to the data line and an output of the first driver; and
a second buffer coupled to the plate and an output of the second driver.

17. The apparatus of claim 16, wherein the circuitry includes:
a first capacitor coupled to an input of the first buffer and the output of the first driver; and
a second capacitor coupled to an input of the second buffer and the output of the second driver;
wherein a capacitance of the first capacitor is less than a capacitance of the second capacitor.

18. The apparatus of claim 15, wherein:
a first voltage is provided to a transistor of the first driver to apply the voltage to the data line;
a second voltage is provided to a transistor of the second driver to apply the voltage to the plate; and
a magnitude of the first voltage is greater than a magnitude of the second voltage.

19. The apparatus of claim 15, wherein:
a first voltage is provided to the first driver to apply the voltage to the data line;
a second voltage is provided to the second driver to apply the voltage to the plate; and
the first voltage is less than the second voltage.

20. The apparatus of claim 19, wherein:
the first voltage is a negative voltage; and
the second voltage is a positive voltage.

* * * * *